(12) United States Patent
Thomas et al.

(10) Patent No.: US 11,598,021 B2
(45) Date of Patent: Mar. 7, 2023

(54) CVD APPARATUS

(71) Applicant: GlobalWafers Co., Ltd., Hsinchu (TW)

(72) Inventors: Shawn George Thomas, Chesterfield, MO (US); Gang Wang, Grover, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 275 days.

(21) Appl. No.: 15/764,276

(22) PCT Filed: Sep. 29, 2016

(86) PCT No.: PCT/US2016/054507
§ 371 (c)(1),
(2) Date: Mar. 28, 2018

(87) PCT Pub. No.: WO2017/059114
PCT Pub. Date: Apr. 6, 2017

(65) Prior Publication Data
US 2018/0282865 A1 Oct. 4, 2018

Related U.S. Application Data

(60) Provisional application No. 62/235,826, filed on Oct. 1, 2015.

(51) Int. Cl.
*C30B 25/12* (2006.01)
*C23C 16/458* (2006.01)
(Continued)

(52) U.S. Cl.
CPC .......... *C30B 25/12* (2013.01); *C23C 16/4585* (2013.01); *C30B 25/10* (2013.01);
(Continued)

(58) Field of Classification Search
CPC ......... H01L 21/67109; H01L 21/67115; H01L 21/68735; C23C 16/4585; C23C 16/481; C23C 16/482; C23C 16/45504; C23C 16/45508; C23C 16/4583; C23C 16/4584; C23C 16/4586; C30B 25/12; C30B 25/10; C30B 25/105; C30B 25/15; C30B 25/02;
(Continued)

(56) References Cited

U.S. PATENT DOCUMENTS 6,170,433 B1 * 1/2001 Du Bois ........... H01L 21/68792
118/725
6,364,957 B1 * 4/2002 Schneider ........... C23C 16/4585
118/500
(Continued)

FOREIGN PATENT DOCUMENTS

EP 0606751 A1 7/1994
EP 1475823 B1 8/2008
(Continued)

*Primary Examiner* — Benjamin Kendall
*Assistant Examiner* — Kurt Sweely
(74) *Attorney, Agent, or Firm* — Armstrong Teasdale LLP

(57) ABSTRACT

A preheat ring (126) for use in a chemical vapor deposition system includes a first portion and a second portion selectively coupled to the first portion such that the first and second portions combine to form an opening configured to receive a susceptor therein. Each of the first and second portions is independently moveable with respect to each other.

12 Claims, 9 Drawing Sheets

(51) Int. Cl.
 *C30B 25/10* (2006.01)
 *H01L 21/687* (2006.01)
 *H01L 21/67* (2006.01)
(52) U.S. Cl.
 CPC .... *H01L 21/68735* (2013.01); *C23C 16/4586* (2013.01); *C30B 25/105* (2013.01); *H01L 21/67115* (2013.01)
(58) Field of Classification Search
 CPC .... C30B 25/08; C30B 25/14; H01J 37/32642; H01J 37/32715; H01J 37/32724
 See application file for complete search history.

(56) References Cited

U.S. PATENT DOCUMENTS

| | | | |
|---|---|---|---|
| 6,853,802 B2* | 2/2005 | Neyret | H01L 21/67103 118/724 |
| 10,047,457 B2 | 8/2018 | Shah et al. | |
| 2004/0149389 A1* | 8/2004 | Fink | H01J 37/32642 156/345.51 |
| 2008/0127894 A1* | 6/2008 | Sumakeris | C30B 25/10 118/725 |
| 2012/0103263 A1* | 5/2012 | Myo | H01L 21/68792 118/728 |
| 2012/0263875 A1* | 10/2012 | Brenninger | H01L 21/6719 427/248.1 |
| 2014/0273410 A1* | 9/2014 | Abedijaberi | H01L 21/02532 438/478 |
| 2015/0083046 A1 | 3/2015 | Ranish et al. | |
| 2015/0162230 A1* | 6/2015 | Bautista | C30B 25/10 118/725 |

FOREIGN PATENT DOCUMENTS

| | | |
|---|---|---|
| JP | H06132231 A | 5/1994 |
| JP | H1060624 A | 3/1998 |
| JP | 2003142408 A | 5/2003 |
| JP | 2004134625 A | 4/2004 |
| WO | 2015076487 A1 | 5/2015 |

* cited by examiner

CVD APPARATUS

CROSS-REFERENCE TO RELATED APPLICATIONS

This application is the 35 U.S.C. § 371 national stage of International Application No. PCT/US2016/054507, filed 29 Sep. 2016, which claims priority to U.S. Provisional Application No. 62/235,826, filed 1 Oct. 2015, each of which is hereby incorporated by reference herein in its entirety.

FIELD OF THE DISCLOSURE

The field of the disclosure relates generally to apparatus and methods for wafer processing, and more particularly to apparatus and methods for tuning the temperature at the wafer edge to reduce or eliminate slip.

BACKGROUND

In a single-wafer thermal process chamber, a semiconductor wafer is supported by a susceptor. The wafer edge includes a transition region between the susceptor and the wafer. The emissivity of the wafer and the susceptor rim can be different relative to one another, especially when one or more films are present on the wafer. The difference in emissivity can induce a substantial temperature gradient between the wafer edge and the susceptor rim. As a result, crystalline defects such as slip lines may form at the wafer edge. Additionally, the temperature gradient can cause non-uniformity in deposition thickness, chemical concentration, or etch rate depending on the type of the thermal processes.

To obtain uniform film material properties across the wafer, the edge effect needs to be well controlled. In practice, there are several parameters that are used to tune the edge thermal and chemical environment, such as arrangements of heating elements and lower chamber purge gas flows. However, certain parameters may help to control the edge effect, but have undesired effects elsewhere on the wafer.

The gap between the susceptor and the preheat ring is an important parameter that influences both the gas flow and the thermal coupling between the ring and the susceptor. In at least some known systems, the gap (known as the ring gap) between the susceptor and ring is fixed and thus not tunable.

Accordingly, a need exists for a preheat ring capable of controlling the size of the ring gap at multiple locations around the susceptor to enable tuning of the thermal gradient between the susceptor and the preheat ring.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a chemical vapor deposition system includes a susceptor and a preheat ring configured to form an opening for receiving the susceptor therein. The susceptor is spaced from the preheat ring to form a substantially circular gap therebetween. The preheat ring includes a first portion and a second portion selectively coupled to the first portion. Each of the first portion and the second portion is independently moveable with respect to each other to control a size of the gap.

In another aspect, a preheat ring for use in a chemical vapor deposition system includes a first portion and a second portion selectively coupled to the first portion such that the first and second portions combine to form an opening configured to receive a susceptor therein. Each of the first and second portions is independently moveable with respect to each other.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
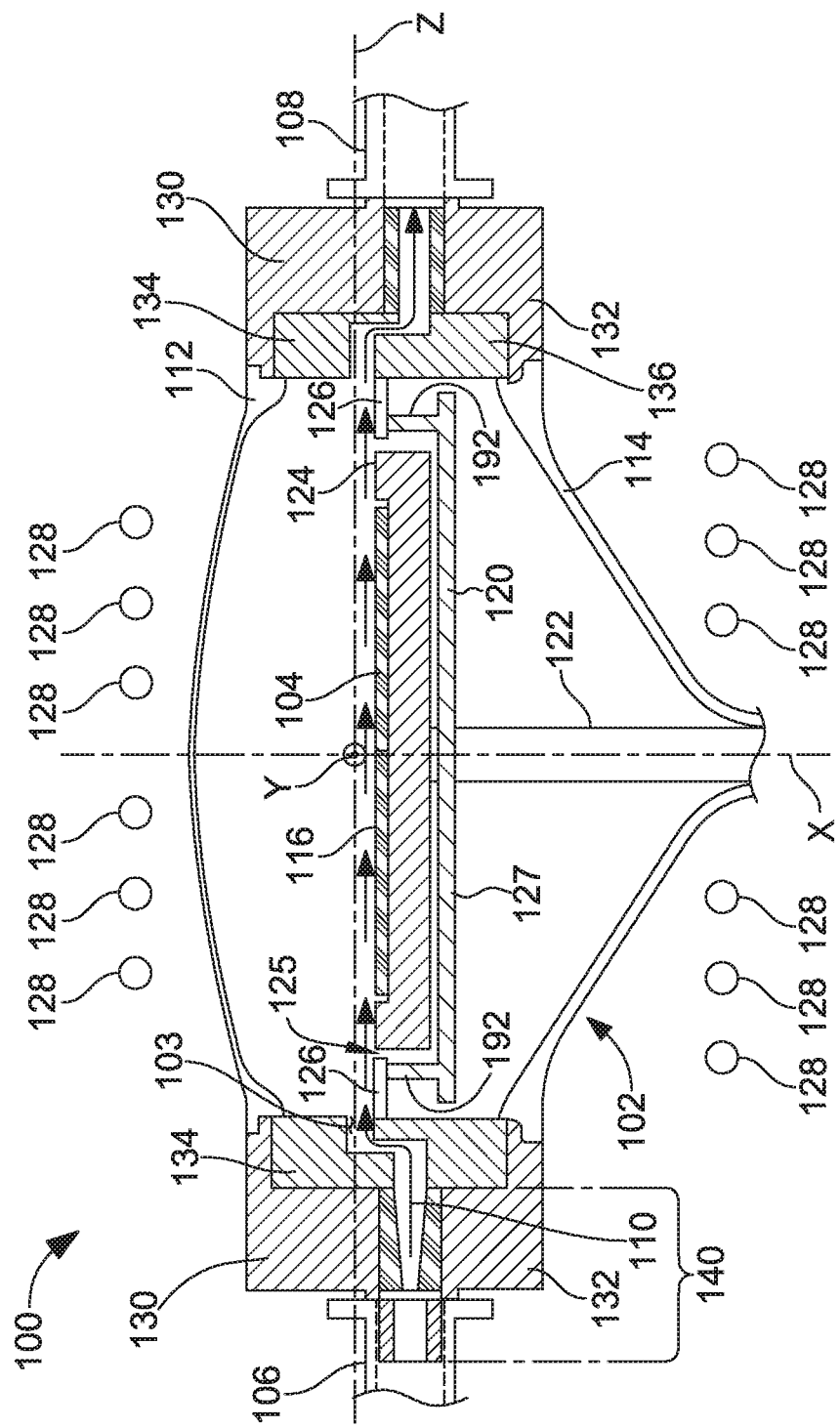
FIG. 1 is a cross-section of a chemical vapor deposition system including a preheat ring of one embodiment of the present disclosure.
Figure 2:
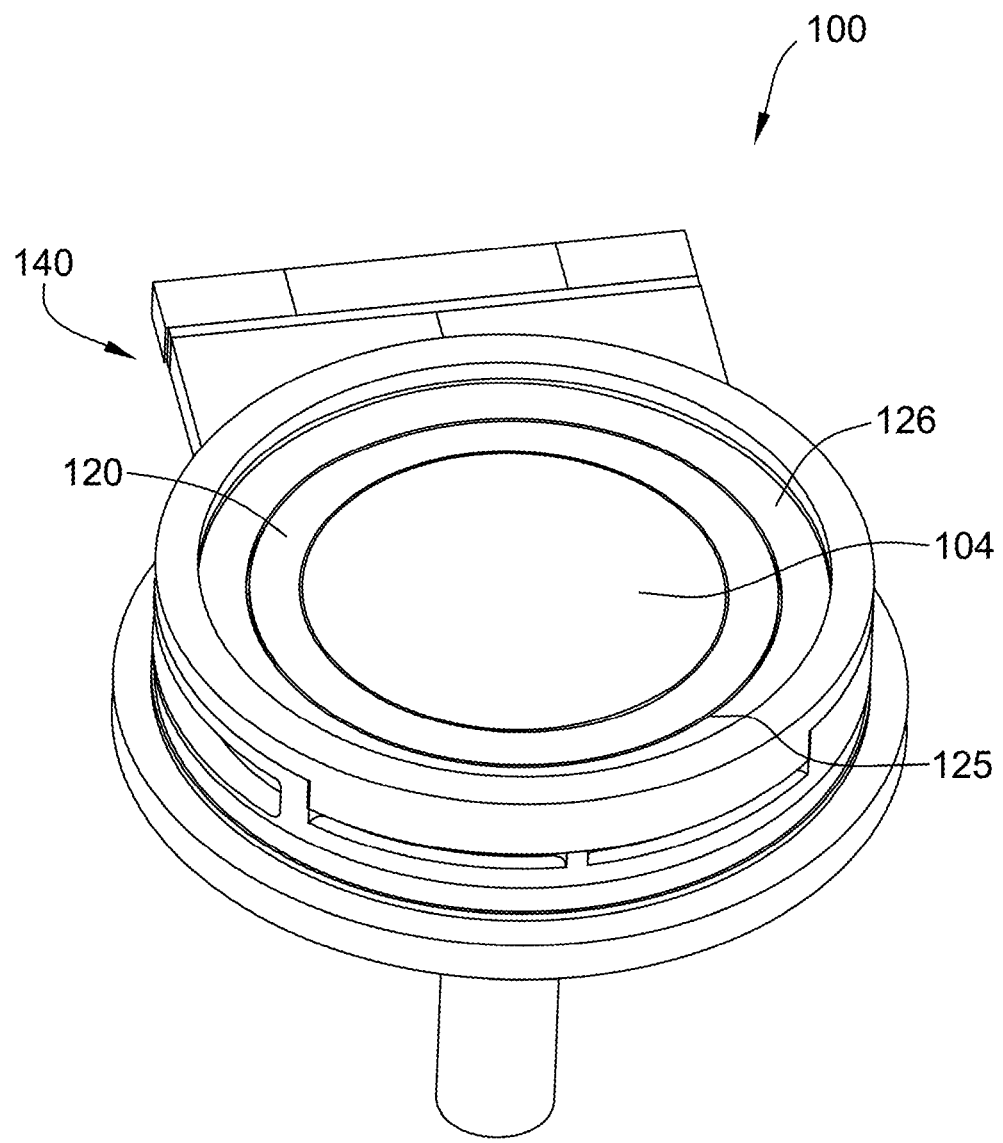
FIG. 2 is a perspective view of the chemical vapor deposition system of FIG. 1.

FIG. 1 is a cross-section of a chemical vapor deposition (CVD) system 100, and FIG. 2 is a perspective view of the chemical vapor deposition system 100. The illustrated system 100 is a single substrate system, however, the system and methods disclosed herein for tuning the temperature at a wafer edge to reduce slip are suitable for use in other system designs including, for example, multiple substrate systems.

The CVD system 100 includes a reaction or processing chamber 102 for depositing and/or growing thin films on a substrate 104 (e.g., a silicon semiconductor wafer or a silicon-on-insulator (SOI) semiconductor wafer), a gas injection port 106 disposed at one end of the processing chamber 102, and a gas discharge port 108 disposed at an opposite end of the processing chamber 102. A gas manifold 140 disposed between the gas injecting port 106 and the processing chamber 102 is used to direct incoming gas 110 into the processing chamber 102 enclosed by an upper window 112 and a lower window 114 through the gas injection port 106.

In operation, an incoming process gas 110 flows through the gas manifold 140 and into the reaction chamber 102 through gas inlet 103. The gas 110 then flows over the substrate surface 116 and reacts with the substrate surface 116, or precursors disposed thereon, to deposit a film on the substrate surface 116. The gas 110 then flows out of the reaction chamber 102 and through the gas discharge port 108.

The substrate 104 upon which the film is deposited is supported by a susceptor 120 within the reaction chamber 102. The susceptor 120 is connected to a shaft 122 that is connected to a motor (not shown) of a rotation mechanism (not shown) for rotation of the shaft 122, susceptor 120 and substrate 104 about a vertical axis X of the CVD system 100. The outside edge 124 of the susceptor 120 and inside edge of a preheat ring 126, for heating the incoming gas 110 prior to contact with the substrate 104, are separated by a substantially circular gap 125 to allow rotation of the susceptor 120. The gap 125 includes a gap size within a range of approximately 1.0 mm and 10.0 mm. The substrate 104 is rotated to prevent an excess of material from being deposited on the wafer leading edge and provide a more uniform epitaxial layer. System 100 also includes a preheat ring support 127 that supports preheat ring 126 and facilitates moving portions of preheat ring 126 along a horizontal Z axis, as described in further detail below.

Incoming gas 110 may be heated prior to contacting the substrate 104. Both the preheat ring 126 and the susceptor 120 are generally opaque to absorb radiant heating light produced by high intensity radiant heating lamps 128 that may be located above and below the reaction chamber 102. Equipment other than high intensity lamps 128 may be used to provide heat to the reaction chamber 102 such as, for example, resistance heaters and inductive heaters. Maintaining the preheat ring 126 and the susceptor 120 at a temperature above ambient allows the preheat ring 126 and the susceptor 120 to transfer heat to the incoming gas 110 as the gas 110 passes over the preheat ring 126 and the susceptor 120. The diameter of the substrate 104 may be less than the diameter of the susceptor 120 to allow the susceptor 120 to heat incoming gas 110 before it contacts the substrate 104. The preheat ring 126 and susceptor 120 may be constructed of opaque graphite coated with silicon carbide.

The upper and lower windows 112, 114 each comprise a generally annular body made of a transparent material, such as quartz, to allow radiant heating light to pass into the reaction chamber 102 and onto the preheat ring 126, the susceptor 120, and the wafer 104. The windows 112, 114 may be planar, or, as shown in FIG. 1, the windows 112, 114 may have a generally dome-shaped configuration. In other embodiments, one or both of the windows 112, 114 may have an inwardly concave configuration. The upper and lower windows 112, 114 are coupled to the upper and lower chamber walls 130, 132 of the processing chamber 102, respectively.

The upper and lower chamber walls 130, 132 define the outer perimeter of the processing chamber 102, and abut the gas injection port 106 and the gas discharge port 108.

The CVD system 100 may include upper and lower liners 134, 136 disposed within the processing chamber to prevent reactions between the gas 110 and the chamber walls 130, 132 (which are typically fabricated from metallic materials, such as stainless steel). The liners 134, 136 may be fabricated from suitably non-reactive materials, such as quartz.

Figure 3:
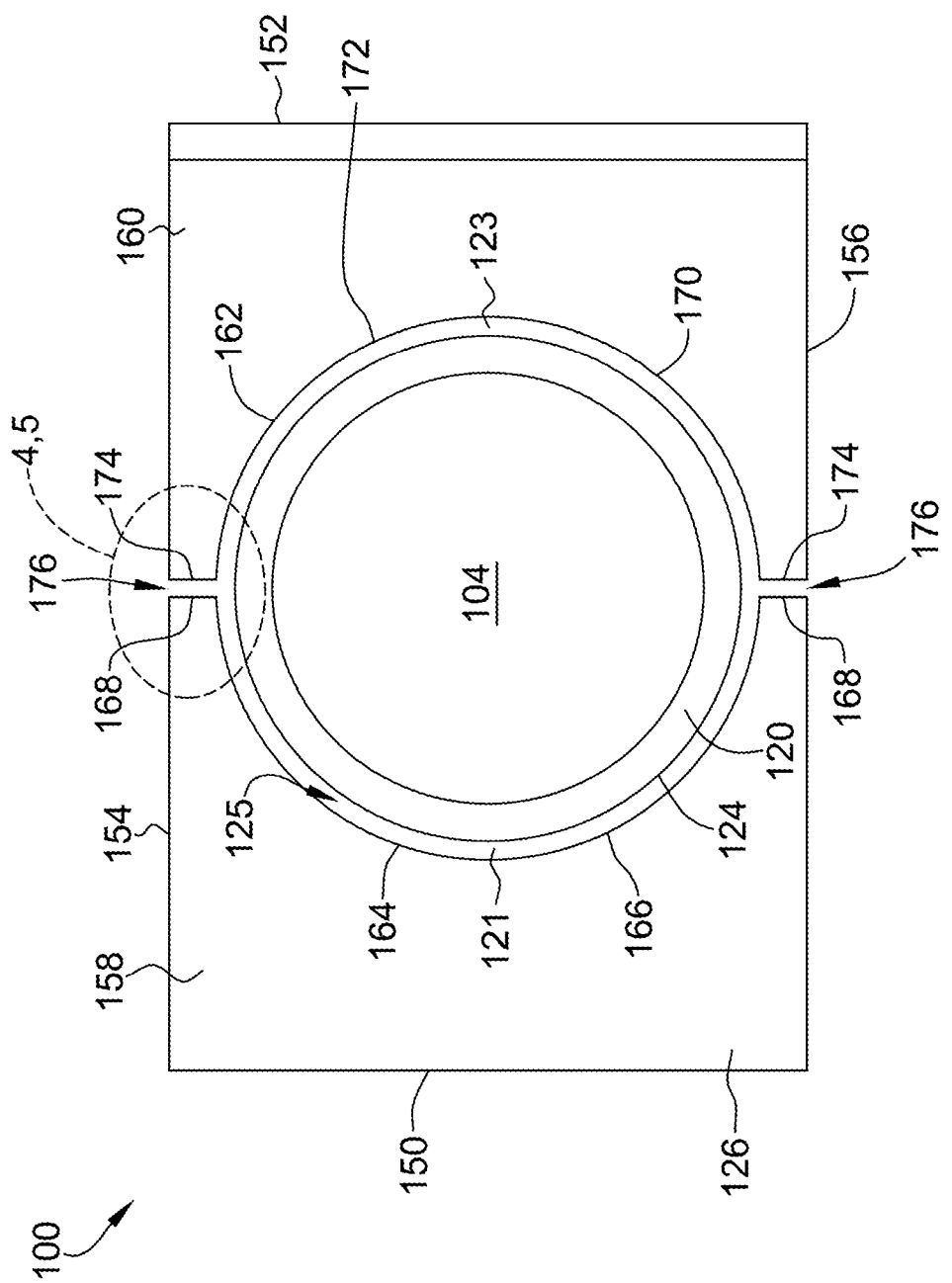
FIG. 3 is a top view of the chemical vapor deposition system of FIG. 1, with certain components removed for illustration.

FIG. 3 is a top view of the chemical vapor deposition system 100, with certain components removed for illustration. In one embodiment, the preheat ring 126 includes a first side 150, a second side 152 opposite the first side 150, a first end 154, and a second end 156 opposite the first end 154. Although the preheat ring 126 is shown in FIG. 3 as substantially rectangular, in other embodiments, the preheat ring 126 is any shape, such as but not limited to, circular, that facilitates operation of CVD system 100 as described herein.

Furthermore, the preheat ring 126 includes a first portion 158 extending from the first side 150 between the ends 154 and 156 and also a second portion 160 extending from the second side 152 between the ends 154 and 156. The first portion 158 and the second portion 160 are selectively coupled to each other such that the first portion 158 and the second portion 160 combine to form an opening 162 configured to receive the susceptor 120 therein. As described in further detail below, the first portion 158 and the second portion 160 are each independently moveable with respect to each other.

In the illustrated embodiment, the first portion 158 includes a first inner side 164 opposite the first side 150 of the first portion 158. The first inner side 164 includes a cutout portion 166 and a first joining face 168 on either side of the cutout portion 166. Specifically, the cutout portion 166 is semi-circular in shape and is configured to receive at least a portion of the susceptor 120 therein. Furthermore, each first joining face 168 extends from a respective one of the first and second ends 154 and 156 to the cutout portion 166 such that the cutout portion 166 is substantially centered between the first and second ends 154 and 156.

Similarly, the second portion 160 includes a second inner side 170 opposite the second side 152 of the second portion 160 and facing the first inner side 164. The second inner side 170 includes a cutout portion 172 and a second joining face 174 on either side of the cutout portion 172. Specifically, the cutout portion 172 is semi-circular in shape and is configured to receive at least a portion of the susceptor 120 therein. Furthermore, each second joining face 174 extends from a respective one of the first and second ends 154 and 156 to the cutout portion 172 such that the cutout portion 172 is substantially centered between the first and second ends 154 and 156. Cutout portions 166 and 172 combine to form opening 162 for the susceptor 120.

In the example embodiment, first joining face 168 and second joining face 174 are selectively coupled together to form a joint 176 between the first portion 158 and the second portion 160.

As shown in FIG. 3, the gap 125 is a substantially continuous circular gap formed between the susceptor 120 and the first and second portions 158 and 160 of the preheat ring 126. More specifically, the gap 125 includes a first gap 121 formed between the susceptor 120 and the cutout portion 166 of the first portion 158, and a second gap 123 formed between the susceptor 120 and the cutout portion 172 of the second portion 160.

Figure 4:
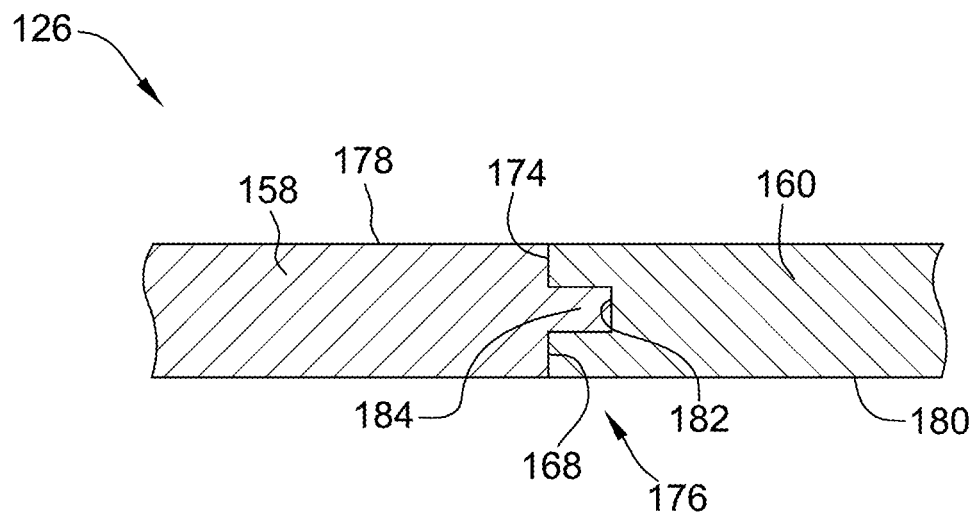
FIG. 4 is a cross-sectional view of an exemplary preheat ring indicated by area 4 in FIG. 3.

FIG. 4 is a cross-sectional view of the joint 176 of preheat ring 126 indicated by area 4 in FIG. 3. The preheat ring 126 includes a top surface 178 and an opposing bottom surface 180. In the example embodiment, the first joining face 168 and the second joining face 174 at least partially overlap such that the joint 176 forms a seal between areas above and below the preheat ring 126 with the chamber 102 (shown in FIG. 1). FIG. 4 illustrates one embodiment of the preheat ring 126 where the second joining face 174 of the second portion 160 includes a groove 182 defined therein between the top surface 178 and the bottom surface 180. Additionally, the first joining face 168 of the first portion 158 includes a protrusion 184 extending therefrom. The protrusion 184 is configured to engage the groove 180 to facilitate selectively coupling the first portion 158 to the second portion 160 and forming the joint 176.

In the example embodiment, the groove 182 and the protrusion 184 are formed substantially midway between the top and the bottom surfaces 178 and 180. In other embodiments, the groove 182 and the protrusion 184 are formed at any position between the surfaces 178 and 180 that facilitates operation of the preheat ring 126 as described herein. Although FIG. 4 illustrates the first portion 158 as including the protrusion 184 and the second portion 160 as including the groove 182, the first portion 158 may include the groove 182 and the second portion 160 may include the protrusion 184.

Figure 5:
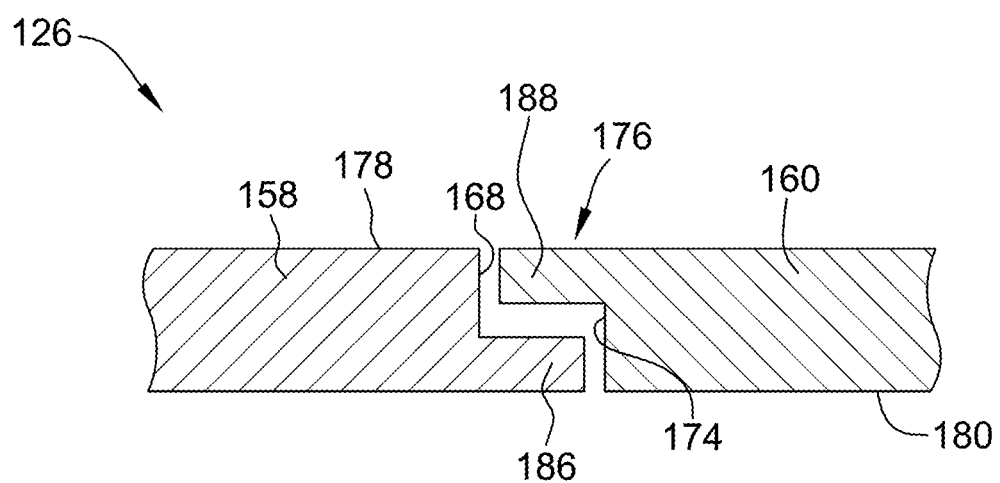
FIG. 5 is a cross-sectional view of another embodiment of a preheat ring indicated by area 5 in FIG. 3.

FIG. 5 is a cross-sectional view of another embodiment of the preheat ring 126 indicated by area 5 in FIG. 3. Like components between FIGS. 4 and 5 are numbered alike. FIG. 5 illustrates an embodiment of the preheat ring 126 where the first joining face 168 of the first portion 158 includes a flange 186 extending toward the second portion 160 from the bottom surface 180. Additionally, the second joining face 174 of the second portion 160 includes a flange 188 extending toward the first portion 158 from the top surface 178. The flanges 186 and 188 are configured to engage one another in an overlapping configuration to facilitate selectively coupling the first portion 158 to the second portion 160 and forming the joint 176. Although FIG. 5 illustrates the first portion 158 as including the bottom flange 186 and the second portion 160 as including the top flange 188, the first portion 158 may include the top flange 188 and the second portion 160 may include the bottom flange 186.

Figure 6:
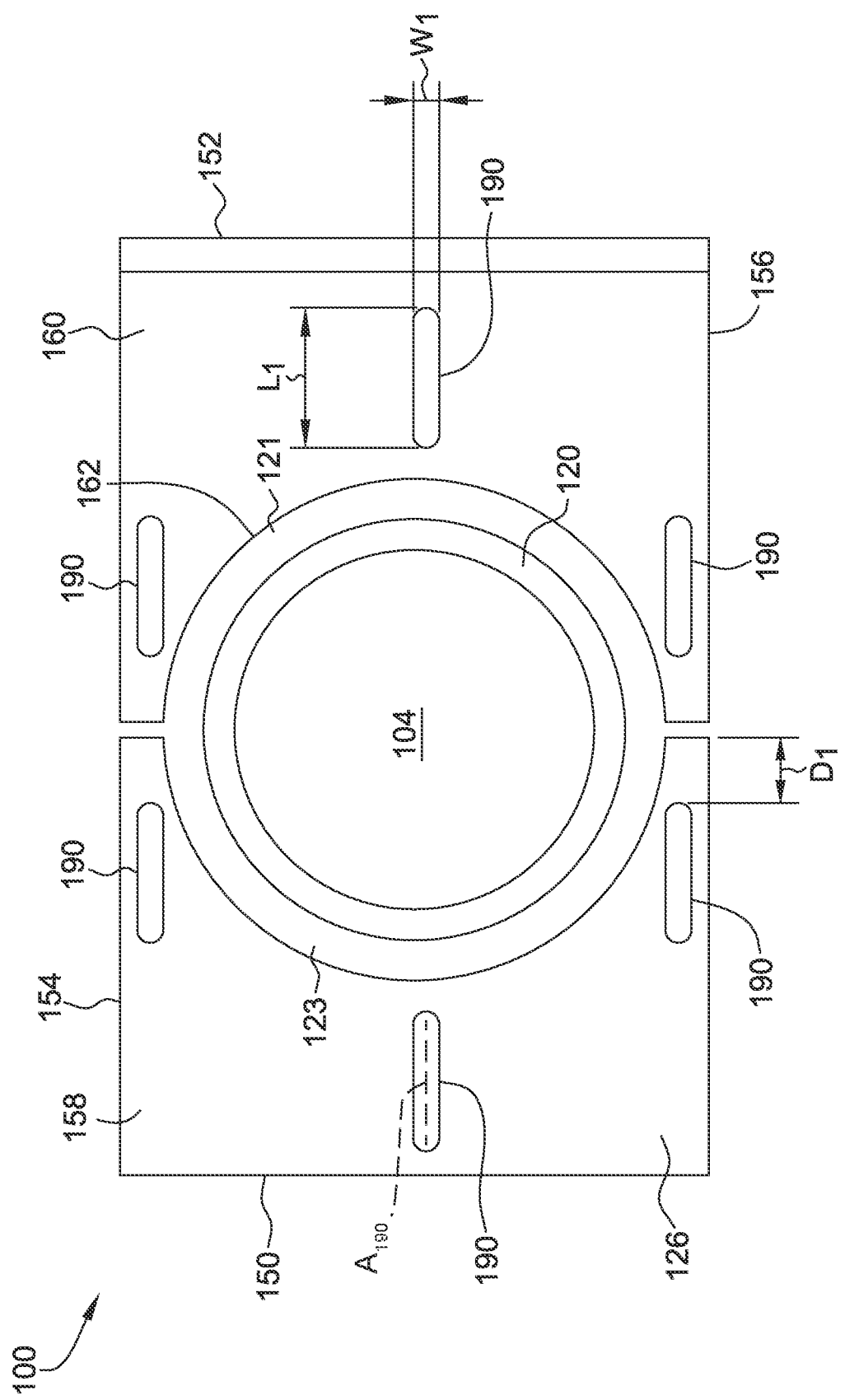
FIG. 6 is a bottom view of the preheat ring.

FIG. 6 is a bottom view of the preheat ring 126. In the example embodiment, each of the first portion 158 and the second portion 160 includes a plurality of grooves 190 defined therein. Each groove 190 is configured to engage a post 192 (shown in FIG. 1) of the ring support 127 (shown in FIG. 1). More specifically, each of the first portion 158 and the second portion 160 includes three parallel grooves 190, the ring support 127 includes six posts 192, each configured to engage a respective groove 190. Each groove 190 includes a major axis $A_{190}$ having a length L1 within a range of approximately 10.0 millimeters (mm) to 30.0 mm and a width W1 within a range of approximately 1.0 mm and 5.0 mm. In other embodiments, each groove 190 includes any length L1 and a width W1 that facilitates operation of CVD system 100 as described herein. Additionally, each groove 190 is spaced from respective inner sides 164 and 170 a minimum distance D1 of approximately 10.0 mm and 30.0 mm.

In operation, the ring support 127 moves along the Z axis (shown in FIG. 1) such that the posts 192 of the ring support 127 slide along the grooves 190 of the preheat ring 126 to facilitate independently moving the first portion 158 and the second portion 160 to control the size of the gap 125 formed between the susceptor 120 and the preheat ring 126. More specifically, the first portion 158 of the preheat ring 126 can be moved independently from the second portion 160 using the ring support 127 to tune the first gap 121 between the first portion 158 and the susceptor 120. Similarly, the second portion 160 of the preheat ring 126 can be moved independently from the first portion 158 using the ring support 127 to tune the second gap 123 between the second portion 160 and the susceptor 120.

In the example embodiment, the ring support 127 is manually adjusted via a maintenance opening (not shown) in the chamber 102 such that the chamber 102 can remain closed during operation. In another embodiment, a drive mechanism (not shown) is mechanically operable to independently move the first portion 158 and the second portion 160. As such, the gaps 121 and 123 can be independently adjusted for a given set of system 100 hardware.

Accordingly, the first and second gaps 121 and 123 on respective sides of the susceptor 120 between the susceptor 120 and the first portion 158 and the susceptor 120 and the second portion 160 can be adjusted independently without the need to re-center the susceptor 120, providing for less complex maintenance. When the first gap 121 between the susceptor 120 and the first portion 158 changes, the size of the gap 125 proximate the joint 176 does not change significantly and the second gap 123 between the susceptor 120 and the second portion 160 does not change, vice versa.

The first gap 121 between the susceptor 120 and the first portion 158 may be a first distance, and the second gap 123 between the susceptor 120 and the second portion 160 is a second distance that is different from the first distance. As such, the preheat ring 126 and ring support 127 provide independent control in the thermal and chemical environment at opposite sides of the susceptor 120 without impacting each other. This provides improved process tuning capability. The preheat ring 126 also has the flexibility to change the ring mass at the side of the ring so that the temperature can be tuned locally to a certain degree.

Figure 7:
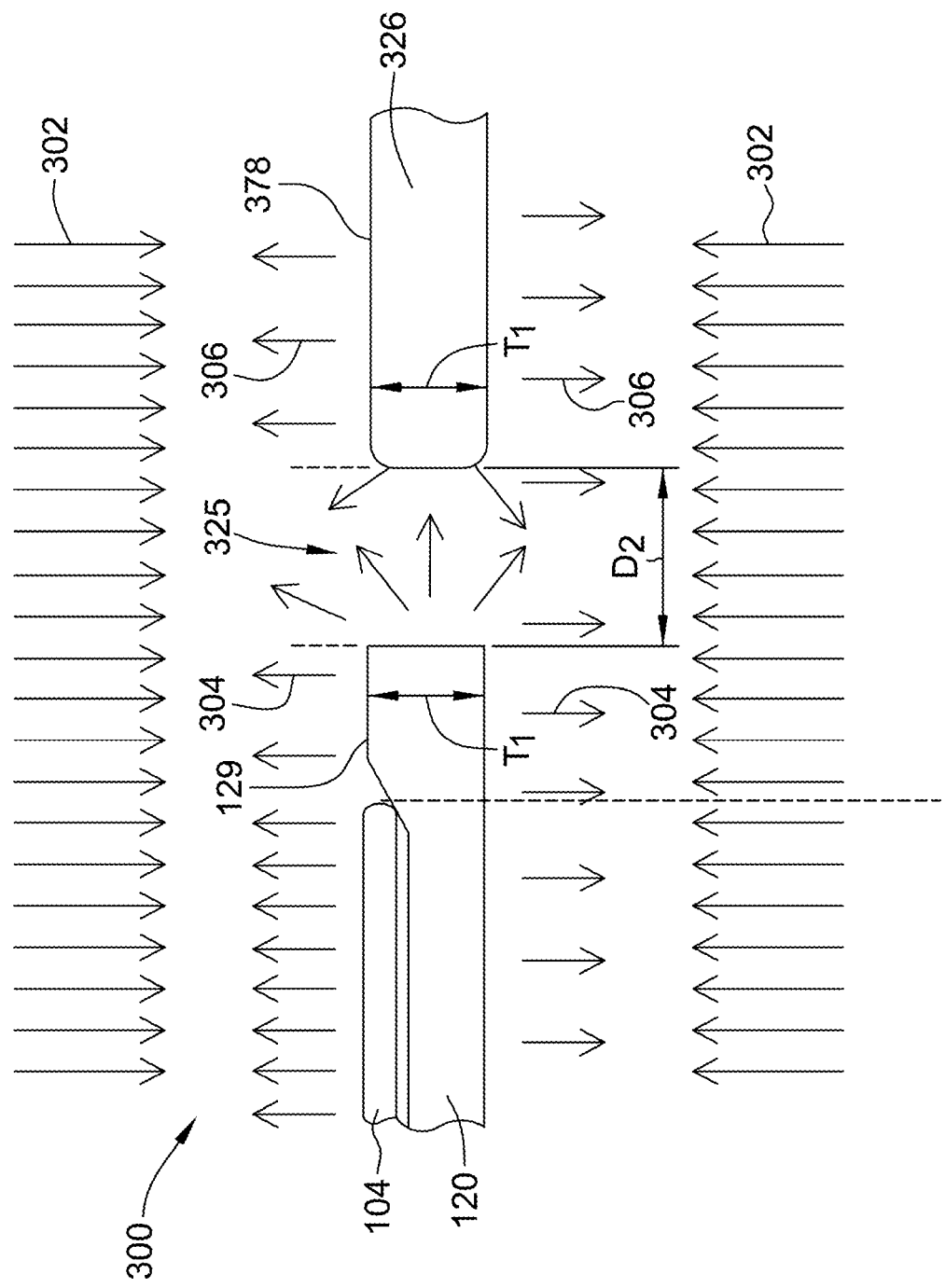
FIG. 7 is an enlarged view of a second configuration of the preheat ring and a susceptor, with certain components removed for illustration.

FIG. 7 is an enlarged view of a first configuration 300 of a preheat ring 326 and the susceptor 120 illustrating a gap 325 formed therebetween. In the first configuration 300, the gap 325 includes a distance D2 within a range of approximately 1.0 mm and 10.0 mm. FIG. 7 illustrates the heat applied to the first configuration 300 by lamps 128 (shown in FIG. 1), as shown by arrows 302. Also shown are the radiant heat emitted by the susceptor 120, shown as arrows 304, and the radiant heat emitted by the preheat ring 326, shown as arrows 306.

In the first configuration 300, the susceptor 120 includes a thickness T1 substantially similar to the thickness T1 of the preheat ring 326. Additionally, the top surface 378 of the preheat ring 326 is substantially flush with a top surface 129 of the susceptor 120. In the first configuration 300, the gap 325 is relatively large to increase the view factor of the susceptor 120 and results in a reduced temperature gradient between the SOI wafer edge and the susceptor rim, which reduces the wafer slip.

Figure 8:
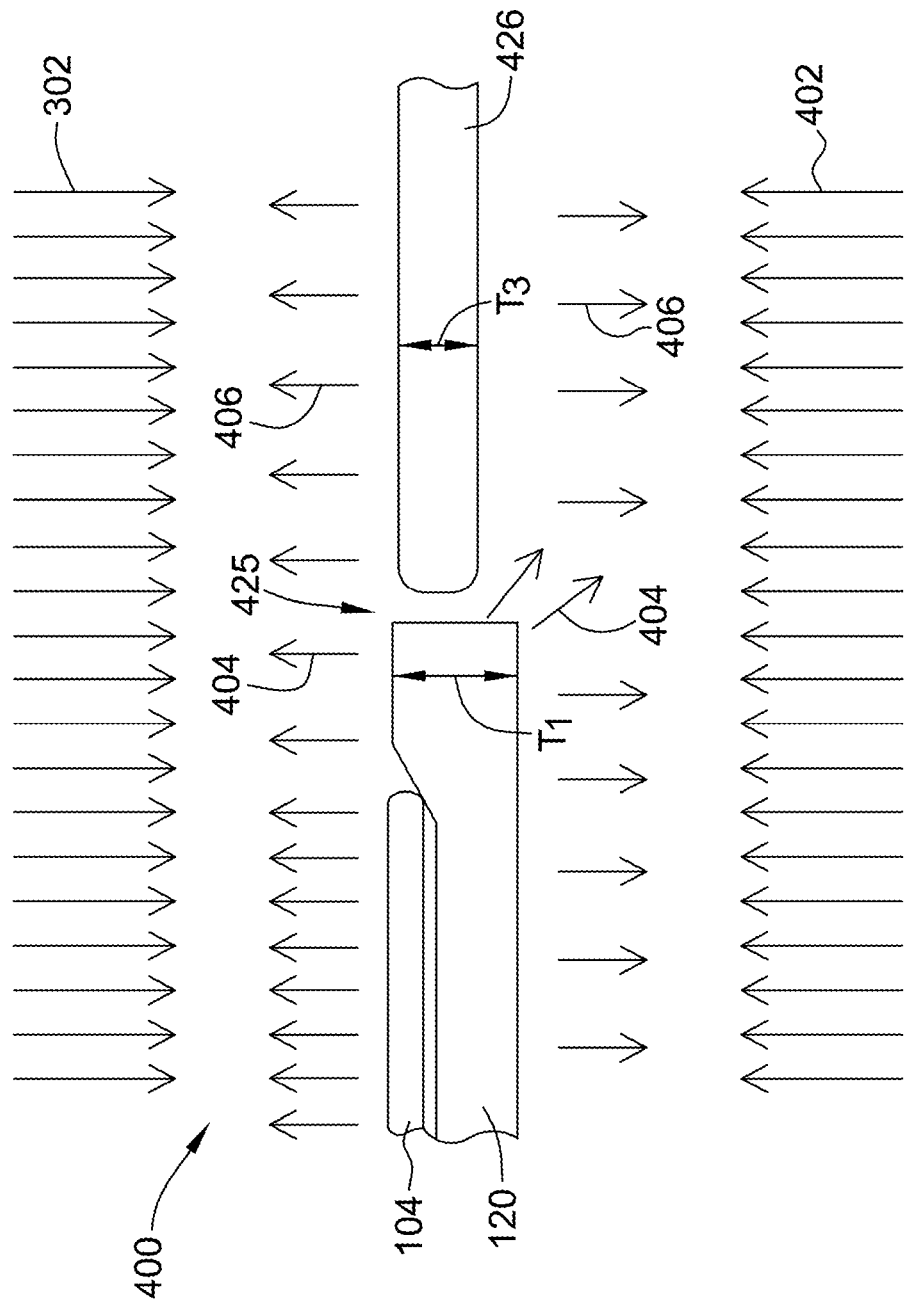
FIG. 8 is an enlarged view of a third configuration of the preheat ring and a susceptor, with certain components removed for illustration.

FIG. 8 is an enlarged view of a second configuration 400 of a preheat ring 426 and the susceptor 120 illustrating a gap 425 formed therebetween. In the second configuration 400, the gap 425 includes a distance smaller than distance D2 in the first configuration 300. FIG. 8 illustrates the heat applied to the second configuration 400 by lamps 128 (shown in FIG. 1), as shown by arrows 402. Also shown are the radiant heat emitted by the susceptor 120, shown as arrows 404, and the radiant heat emitted by the preheat ring 426, shown as arrows 406.

In the second configuration 400, the susceptor 120 includes a thickness T1 that is larger than a thickness T3 of the preheat ring 426. More specifically, the susceptor 120 includes a thickness T1 that is two to three times larger than the thickness T3 of the preheat ring 426. In the second configuration 400, the gap 425 is relatively small, but the heat dissipation of the susceptor 120 is increased because of the reduced thickness T3 of the preheat ring 426.

Figure 9:
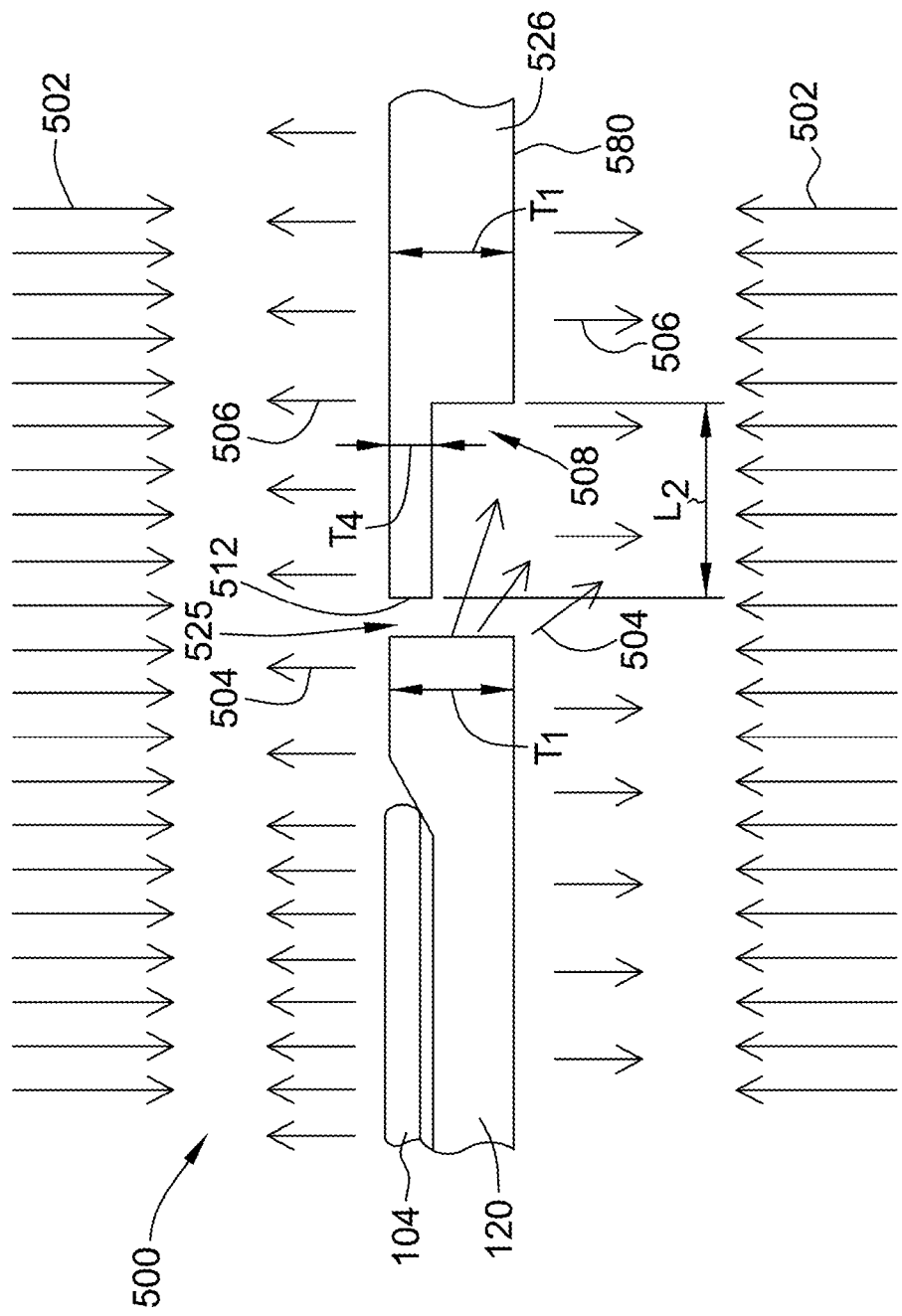
FIG. 9 is an enlarged view of a fourth configuration of the preheat ring and a susceptor, with certain components removed for illustration.

FIG. 9 is an enlarged view of a third configuration 500 of a preheat ring 526 and the susceptor 120 illustrating a gap 525 formed therebetween. In the third configuration 500, the gap 525 includes a distance smaller than distance D2 in the first configuration 300. FIG. 9 illustrates the heat applied to the third configuration 500 by lamps 128 (shown in FIG. 1), as shown by arrows 502. Also shown are the radiant heat emitted by the susceptor 120, shown as arrows 504, and the radiant heat emitted by the preheat ring 526, shown as arrows 506.

In the third configuration 500, the susceptor 120 includes a thickness T1 that is substantially similar to a primary thickness T1 of the preheat ring 526. The preheat ring 526 includes a groove 508 formed in inner side cutout 512 proximate a bottom surface 580. More specifically, the groove 508 is formed in the inner cutout surface 512 and extends into the preheat ring 526 a length L2 within a range of approximately 10.0 mm and 40.0 mm. As such, the preheat ring 526 includes a thickness T4 aligned with the groove 508 that is within a range of approximately one-half to one-third the thickness T1 of the susceptor 120. In the third configuration 500, the heat dissipation of the susceptor 120 is increased because of the reduced thickness T4 of the preheat ring 526 proximate the susceptor 120, while maintaining the mechanical strength of the preheat ring.

Figure 10:
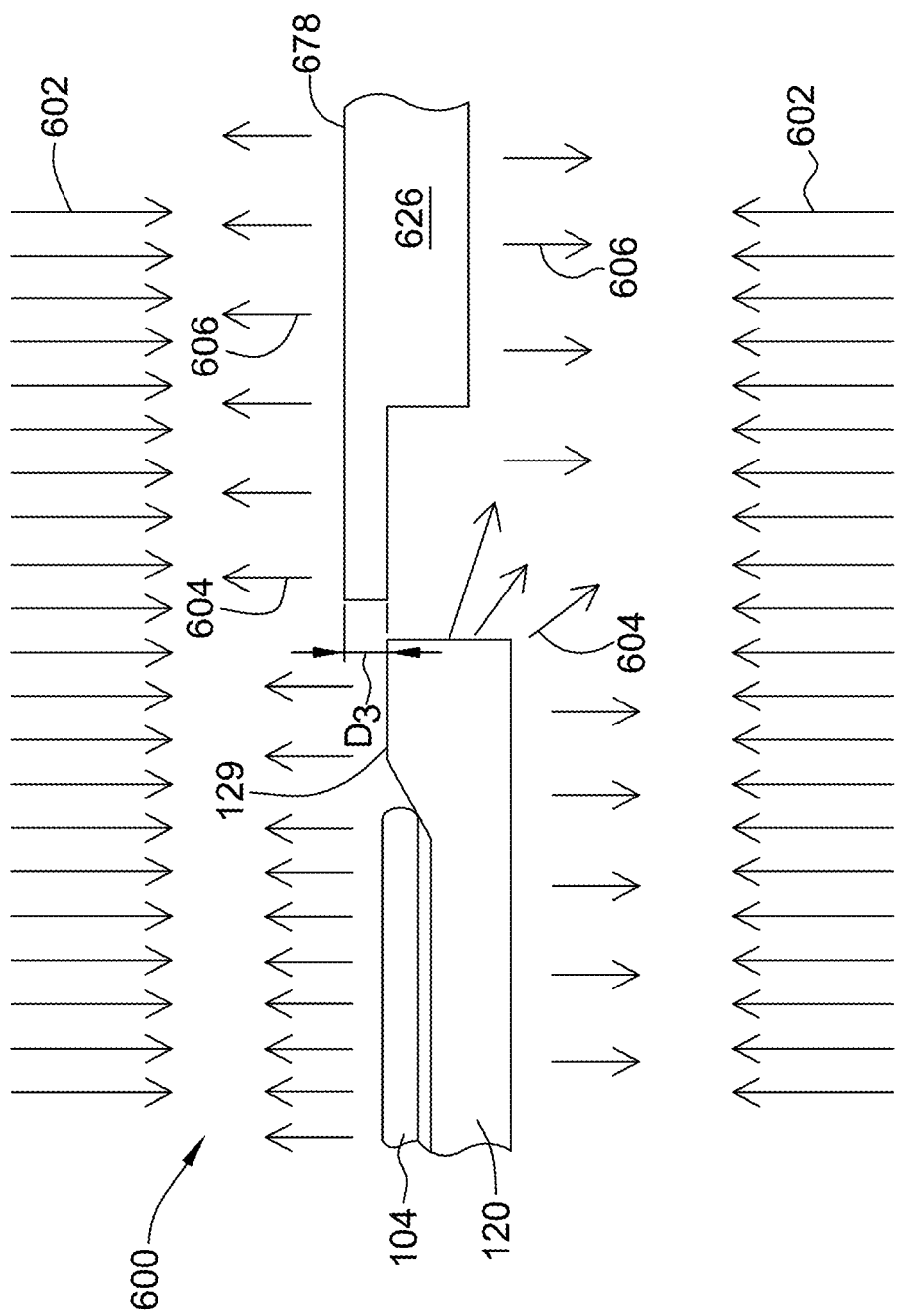
FIG. 10 is an enlarged view of a fifth configuration of the preheat ring and a susceptor, with certain components removed for illustration.

FIG. 10 is an enlarged view of a fourth configuration 600 of a preheat ring 626 and the susceptor 120 illustrating a gap 625 formed therebetween. In the fourth configuration 600, the gap 625 includes a distance smaller than distance D2 in the first configuration 300. FIG. 10 illustrates the heat applied to the fourth configuration 600 by lamps 128 (shown in FIG. 1), as shown by arrows 602. Also shown are the radiant heat emitted by the susceptor 120, shown as arrows 604, and the radiant heat emitted by the preheat ring 626, shown as arrows 606. Although the preheat ring 626 shown in the fourth configuration 600 is substantially similar to the preheat ring in the third configuration 500, either preheat ring 626 from the first and second configurations, 300 and 400, may be used.

In the fourth configuration 600, the top surface of the susceptor 120 is offset from a top surface 678 of the preheat ring 626 by a distance D3 within a range of approximately 0.5 mm and 3.0 mm. As such, in the fourth configuration 600, the heat dissipation of the susceptor 120 is increased because of the offset of top surfaces 129 and 678.

In accordance with the present disclosure, the thermal gradient between the wafer edge and the susceptor rim (edge) can be controlled to reduce slip on the wafer supported by the susceptor. The size of the gap between the susceptor and the preheat ring on opposing sides of the susceptor may be adjusted independently by use of a two-piece preheat ring and ring support as described above. Specifically, the preheat ring may be divided into two independently-controllable portions that are selectively moved by the ring support to independently control the size of the gap between the susceptor and each portion of the preheat ring. Accordingly, the gap between the susceptor and a first portion of the preheat ring may be a first distance, and the gap between the susceptor and a second portion of the preheat ring is a second distance that is different from the first distance. The preheat ring and ring support thereby provide independent control in the thermal and chemical environment at opposite sides of the susceptor without impacting each other. Embodiments of the disclosure provide improved process tuning capability.

Additionally, different configurations of the preheat ring change the ring mass at the side of the preheat ring proximate the susceptor so that the temperature can be tuned locally. More specifically, the overall thickness of the preheat ring can be reduced to emit less heat toward the susceptor. In another embodiment, the preheat ring may include a groove that reduces the thickness of the preheat ring only proximate the susceptor. In yet another embodiment, the height of the susceptor and the preheat ring may be offset to reduce the amount of heat emitted by the preheat ring toward the susceptor. Each of these examples facilitates tuning the temperature of the susceptor at its edge to reduce the slip on the silicon wafer or silicon-on-insulator wafer.

When introducing elements of the present invention or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A chemical vapor deposition system comprising:
   a susceptor;
   a preheat ring configured to form an opening for receiving the susceptor therein, wherein the susceptor is spaced from the preheat ring to form a substantially circular gap therebetween, the preheat ring having a top surface and a bottom surface and comprising:
      a first portion;
      a second portion selectively coupled to the first portion, wherein each of the first portion and the second portion is independently moveable along a horizontal axis with respect to each other to control a size of the gap; and
      a first plurality of elongated grooves formed in the bottom surface of the first portion of the preheat ring, wherein the first plurality of elongated grooves consists of all of the elongated grooves formed in the bottom surface of the first portion of the preheat ring, each of the elongated grooves of the first plurality of elongated grooves having a major axis, the major axis of each elongated groove of the first plurality of elongated grooves being parallel to the major axis of the other elongated grooves of the first plurality of elongated grooves; and
      a second plurality of elongated grooves formed in the bottom surface of the second portion of the preheat ring, wherein the second plurality of elongated grooves consists of all of the elongated grooves formed in the bottom surface of the second portion of the preheat ring, each of the elongated grooves of the second plurality of elongated grooves having a major axis, the major axis of each elongated groove of the second plurality of elongated grooves being parallel to the major axis of the other elongated grooves of the second plurality of elongated grooves; and
   a ring support coupled to the preheat ring, the ring support including a plurality of posts, each post of the plurality of posts being received in one of the elongated grooves of the first or second plurality of elongated grooves.

2. The chemical vapor deposition system as set forth in claim 1 wherein the gap size is within a range of 1.0 millimeters (mm) and 10.0 mm.

3. The chemical vapor deposition system as set forth in claim 1 wherein the gap between the susceptor and the first portion is a first distance, and the gap between the susceptor and the second portion is a second distance different from the first distance.

4. The chemical vapor deposition system as set forth in claim 1 wherein the susceptor includes a first thickness and the preheat ring includes a second thickness substantially similar to the first thickness.

5. The chemical vapor deposition system as set forth in claim 1 wherein the susceptor includes a first thickness and the preheat ring includes a second thickness smaller than the first thickness.

6. The chemical vapor deposition system as set forth in claim 1 wherein the susceptor includes a first top surface and the preheat ring includes a second top surface substantially flush with the first top surface.

7. The chemical vapor deposition system as set forth in claim 1 wherein the susceptor includes a first top surface and the preheat ring includes a second top surface offset from the first top surface.

8. The chemical vapor deposition system as set forth in claim 1 wherein the preheat ring includes an inner surface including a groove defined therein.

9. The chemical vapor deposition system as set forth in claim 8 wherein:

the groove extends a distance within a range of 10.0 mm and 40.0 mm into the preheat ring; and the preheat ring includes a first thickness at the inner surface that is one half to one third a thickness of the susceptor.

10. The chemical vapor deposition system as set forth in claim 1 wherein the plurality of posts are configured to slide along the elongated grooves of the first plurality and second plurality of elongated grooves to facilitate independently moving the first and second ring portions to adjust the size of the gap.

11. The chemical vapor deposition system as set forth in claim 1 wherein the ring support extends below the susceptor.

12. The chemical vapor deposition system as set forth in claim 1 further comprising an upper liner and a lower liner, the preheat ring not being supported by the lower liner.

* * * * *